(12) United States Patent
Chen et al.

(10) Patent No.: US 10,715,180 B1
(45) Date of Patent: Jul. 14, 2020

(54) CIRCUIT FOR ERROR CORRECTION AND METHOD OF SAME

(71) Applicant: Beken Corporation, Shanghai (CN)

(72) Inventors: Lulai Chen, Shanghai (CN); Weifeng Wang, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 16/377,907

(22) Filed: Apr. 8, 2019

(30) Foreign Application Priority Data

Mar. 21, 2019 (CN) .......................... 2019 1 0218505

(51) Int. Cl.
*H03M 13/15* (2006.01)
*H03M 13/00* (2006.01)
*H03M 13/29* (2006.01)

(52) U.S. Cl.
CPC ..... *H03M 13/1515* (2013.01); *H03M 13/159* (2013.01); *H03M 13/29* (2013.01); *H03M 13/6575* (2013.01)

(58) Field of Classification Search
CPC .............................................. H03M 13/1515
See application file for complete search history.

(56) References Cited

U.S. PATENT DOCUMENTS

| 4,642,808 | A | * | 2/1987 | Baggen | G11B 20/1833 |
| | | | | | 714/784 |
| 5,587,803 | A | * | 12/1996 | Inoue | H04N 9/8047 |
| | | | | | 375/240.2 |
| 6,694,477 | B1 | * | 2/2004 | Lee | H03M 13/03 |
| | | | | | 714/755 |
| 10,382,060 | B2 | * | 8/2019 | Yazdi | H03M 13/19 |
| 2004/0019842 | A1 | * | 1/2004 | Argon | H03M 13/293 |
| | | | | | 714/755 |
| 2005/0033791 | A1 | * | 2/2005 | Pollock | H03M 13/1575 |
| | | | | | 708/530 |
| 2009/0006899 | A1 | * | 1/2009 | Gara | G06F 11/1012 |
| | | | | | 714/42 |

\* cited by examiner

*Primary Examiner* — Steve N Nguyen
(74) *Attorney, Agent, or Firm* — Schwegman Lundberg & Woessner, P.A.

(57) ABSTRACT

A circuit for error correction comprises a first RS syndrome generator to generate a first RS syndrome for a RS(n, k) code according to a received symbol stream to be decoded, wherein k and n are respective the number of data symbols and the total number of code symbols in the received symbol stream to be decoded; a first decision unit communicatively coupled to the first RS syndrome generator and configured to determine whether there are at least N symbols in the first RS syndrome that equal 0, wherein N is related to a code distance of the RS(n, k) code; and a first adder communicatively coupled to the first decision unit and configured to output a corrected decoded codeword by adding the first RS syndrome to the received symbol stream to be decoded if there are at least N symbols in the first RS syndrome that equal 0.

10 Claims, 8 Drawing Sheets

CIRCUIT FOR ERROR CORRECTION AND METHOD OF SAME

CROSS-REFERENCE TO RELATED APPLICATIONS

This application claims priority to Chinese Application number 201910218505.8 entitled "CIRCUIT FOR ERROR CORRECTION AND METHOD OF SAME," filed on Mar. 21, 2019 by Beken Corporation, which is incorporated herein by reference.

TECHNICAL FIELD

The present application relates to a data transmission, but not exclusively, to a circuit for error correction and a method of the same.

BACKGROUND

Bose-Chaudhuri-Hocquenghem (BCH) codes includes Reed-Solomon (RS) code. A conventional decoding scheme for a RS code usually has the following steps: calculating a syndrome Sx for the RS code to be decoded; calculating the root of the error position polynomial of the syndrome Sx; and performing Chien search.

For a RS(12,9) code for example, where 9 is the number of data symbols in the received symbol stream to be decoded, and n is the total number of code symbols in the received symbol stream to be decoded, the decoding needs to determine whether the received symbol stream (also called codeword) can be corrected by determining whether a new matrix composed of the syndrome Sx is a singular matrix. At the same time, a decoder needs to calculate a polynomial root after the determination is completed, and then to calculate an error correction value. This conventional method is relatively easy to implement with software, but for hardware implementation, such as Application-specific integrated circuit (ASIC) implementation, the decoder will introduce more complex logic and state machines.

This conventional method has applicability, and can be used for decoding the BCH code. However, applying this conventional method to the shortened RS (12, 9) code not only makes the decoding algorithm more complicated, but also fails to determine and correct error for the RS (12, 9) code where each of the data symbol and the parity symbol (or also called parity check symbol or check symbol) has one error.

SUMMARY

According to an embodiment of the invention, a circuit for error correction, comprises a first Reed-Solomon (RS) syndrome generator, configured to generate a first RS syndrome for a RS(n, k) code according to a received symbol stream to be decoded, wherein k is the number of data symbols in the received symbol stream to be decoded, and n is the total number of code symbols in the received symbol stream to be decoded; a first decision unit communicatively coupled to the first RS syndrome generator and configured to determine whether there are at least N symbols in the first RS syndrome that equal 0, wherein N is related to code distance of the RS(n, k) code; and a first adder communicatively coupled to the first decision unit and configured to output a corrected decoded codeword by adding the first RS syndrome to the received symbol stream to be decoded if there are at least N symbols in the first RS syndrome that equal 0.

According to another embodiment of the invention, a method for error correction, comprises generating, by a first Reed-Solomon (RS) syndrome generator, a first RS syndrome for a RS(n, k) code according to a received symbol stream to be decoded, wherein k is the number of data symbols in the received symbol stream to be decoded, and n is the total number of code symbols in the received symbol stream to be decoded; determining, by a first decision unit communicatively coupled to the first RS syndrome generator, whether there are at least N symbols in the first RS syndrome that equal 0, wherein N is related to a code distance of the RS(n, k) code; and outputting, by a first adder communicatively coupled to the first decision unit, a corrected decoded codeword by adding the first RS syndrome to the received symbol stream to be decoded if there are at least N symbols in the first RS syndrome that equal 0.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Digital Mobile Radio (DMR) is the digital walkie-talkie (also called handheld transceiver) standard defined by the European Telecommunications Standards Institute (ETSI) in 2006. It has advantages of narrower bandwidth, higher spectral efficiency, lower adjacent-band interference, lower power consumption, and supporting data services compared with analog walkie-talkies. DMR is the future development direction for the walkie-talkie.

In the DMR standard, an encoder uses multiple channels to encode data and control frames, and Reed-Solomon (RS) code is one of them. In one embodiment, the encoder uses RS(12,9), which is used as inner codes for Block Product Turbo code (BPTC) and is mainly used to correct the occurrence of consecutive errors of less than 8 bits. According to the characteristics of RS (12,9) code, embodiments of the invention design new decoding methods, which reduce the complexity of decoding and verify the feasibility of the decoding algorithm.

A feature of at least one embodiments of the invention is that to exchange ROM space for 256*8-bit error correction value table and the 27*8-bit error location table for great reduction of the decoding complexity and the decoding time. Further, the embodiments can also correct the errors in the case that both of the data symbol and the parity symbol has one error, which increases coding gain. Further, since the RS codec itself needs to construct a large Galois Field ($2^8$) or $GF(2^8)$ logarithm table, the additional sacrifice of ROM spaces for the error correction value table and the error location table are acceptable for the ASIC implementation.

The main components of an embodiment for a RS(12, 9) code include a syndrome Sx generator, a GF ($2^8$) exponent logarithm table, a syndrome Sx decision unit, an error symbol location table, and an error correction value table.

The syndrome Sx generator comprises three 1-Byte registers, an exclusive OR (modulo-2 adder) and GF ($2^8$) logarithm tables. The Sx generator needs to query the $GF(2^8)$ exponent logarithm table 12 times to get the syndrome Sx.

The syndrome Sx decision unit is mainly used to determine whether there is an error and/or whether the error is correctable. The error correctable condition means that at least two Sx values are 0, which also means that the error symbol occurs in the three parity symbols of the codeword. In this case, the data code is error free and can be output directly.

The error symbol location detection converts the three parity syndromes Sx into an exponential form by querying GF ($2^8$) exponential logarithm table, and then successively find the difference between it and the corresponding values in the error location table. If all of the three differences are equal, the circuit can correct the error, and the circuit determines that the error symbol occurs in the current subtraction position. If two of the three differences are equal, the error is correctable and the error symbol occurs in both the current subtraction position and also the parity symbol. After correcting the data symbol, the circuit can output the corrected data symbol stream directly. If there are no same difference values, the circuit cannot correct the error and the circuit reports the data as incorrect.

For the error correction value table, after an error symbol location detector (which can be implemented by an addressing unit) detects an error symbol, the circuit obtains an error correction value by querying the error correction value table according to the value of the same differences, and the error correction value is added to the error symbol in a modulo two manner (or in other words, (error symbol+error correction value) mod 2) to correct the error.

For the connection, the RS(12,9) error correction circuit has inputs of both a 9-byte data symbol and a 3-byte parity symbol, and the syndrome Sx generator generates a 3-byte syndrome Sx.

The syndrome Sx is used to determine whether the codeword has error or not, and whether the error is correctable, which belongs to the input of the error correction circuit. The error correction circuit further includes an index table, an error location table and an error correction value table. The error correction circuit outputs the corrected codeword, or the original codeword if the error correction has failed.

If there is one symbol error in each of data symbol and the parity symbol, the Sx syndrome generator and the decision unit are called twice, once for correcting the data symbol error and once for determining/correcting the parity symbol error.

After the error code in the original codeword is added with the error correction value, a new decoded codeword is formed together with the original non-error codeword.

The error correction circuit will be discussed in further details with respect to FIG. 1-FIG. 4.

Figure 1:
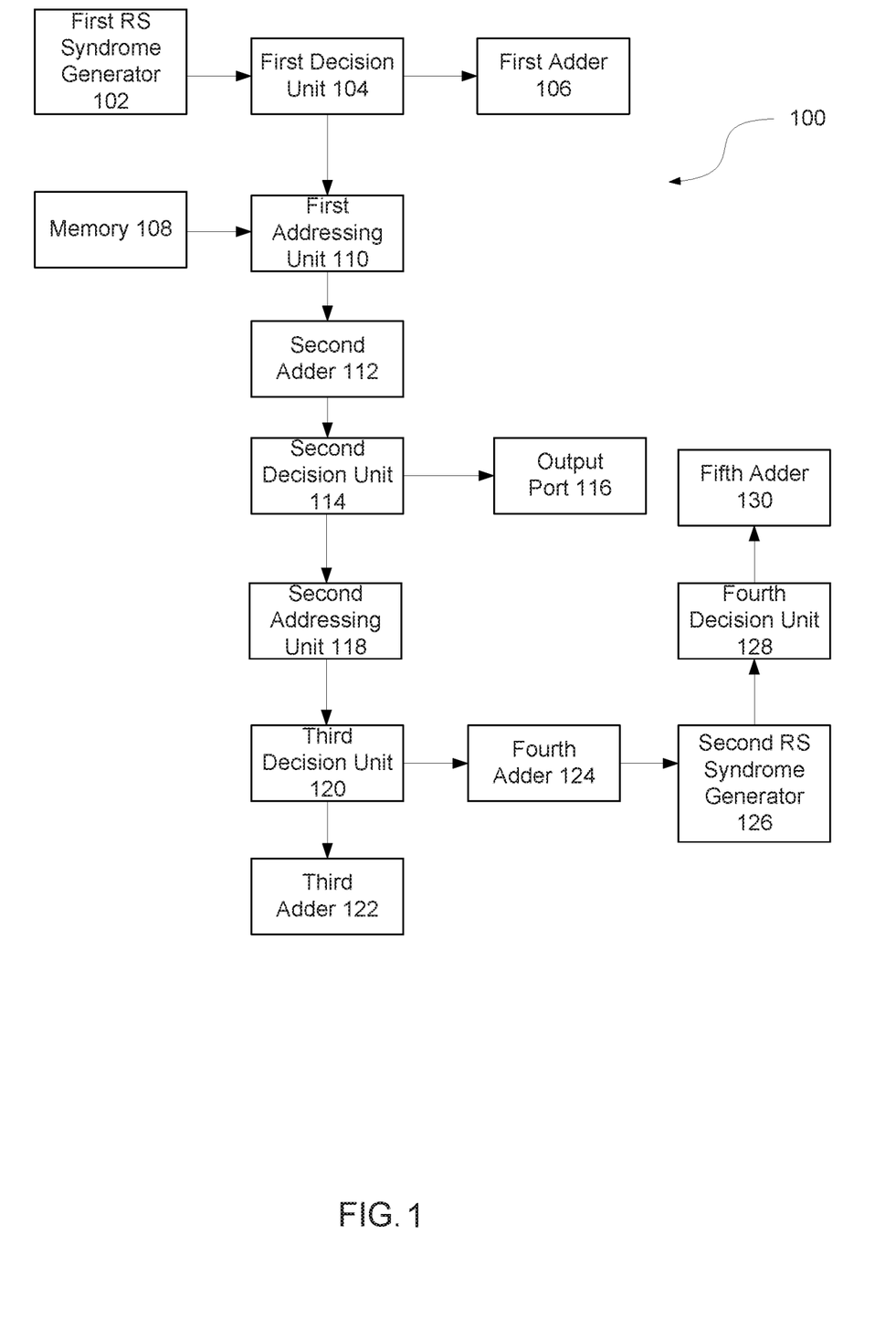
FIG. 1 is a circuit diagram of a circuit for error correction according to an embodiment of the invention.

FIG. 1 is a circuit diagram of a circuit 100 for error correction according to an embodiment of the invention.

The circuit 100 for error correction comprises a first RS syndrome generator 102, a first decision unit 104 and a first adder 106. The first RS syndrome generator 102 is configured to generate a first RS syndrome Sx[0:n−k−1] for a RS(n, k) code according to a received symbol stream u[0:n−1] to be decoded, wherein k is the number of data symbols in the received symbol stream to be decoded, and n is the total number of code symbols in the received symbol stream to be decoded.

The first decision unit 104 is communicatively coupled to the first RS syndrome generator 102 and configured to determine whether there are at least N symbols in the first RS syndrome Sx[0:n−k−1] that equal 0, wherein N is related to code distance of the RS(n, k) code (or corresponds to the maximum error correcting capability of the code). Note although in the embodiments, we use RS (12, 9) code as an example, the embodiments also apply to RS(n, k) codes where n does not equal 12 and k does not equal 9, given the error location table and the error correction value table are adaptively designed.

The first adder 106 is communicatively coupled to the first decision unit 104 and configured to output a corrected decoded codeword c by adding the first RS syndrome Sx[0:n−k−1] to the received symbol stream u[0:n−1] to be decoded if there are at least N symbols in the first RS syndrome Sx[0:n−k−1] that equal 0. In other words, c=u=u[0:n−1]+Sx[0:n−k−1].

Alternatively, the circuit 100 further comprises a memory 108, a first addressing unit 110, a second adder 112 a second decision unit 114, and an output port 116. The memory 108 stores a logarithm table, an error location table and an error correction value table.

Table 1 shows an example logarithm table, table 2 shows an example error location table, and table 3 shows an example error correction value table. All of the three tables may be used for RS(12,9) code.

TABLE 1 example logarithm table

|    | 0   | 1   | 2   | 3   | 4   | 5   | 6   | 7   | 8   | 9   | A   | B   | C   | D   | E   | F   |
|----|-----|-----|-----|-----|-----|-----|-----|-----|-----|-----|-----|-----|-----|-----|-----|-----|
| 00 | —   | 0   | 1   | 25  | 2   | 50  | 26  | 198 | 3   | 223 | 51  | 238 | 27  | 104 | 199 | 75  |
| 10 | 4   | 100 | 224 | 14  | 52  | 141 | 239 | 129 | 28  | 193 | 105 | 248 | 200 | 8   | 76  | 113 |
| 20 | 5   | 138 | 101 | 47  | 225 | 36  | 15  | 33  | 53  | 147 | 142 | 218 | 240 | 18  | 130 | 69  |
| 30 | 29  | 181 | 194 | 125 | 106 | 39  | 249 | 185 | 201 | 154 | 9   | 120 | 77  | 228 | 114 | 166 |
| 40 | 6   | 191 | 139 | 98  | 102 | 221 | 48  | 253 | 226 | 152 | 37  | 179 | 16  | 145 | 34  | 136 |
| 50 | 54  | 208 | 148 | 206 | 143 | 150 | 219 | 189 | 241 | 210 | 19  | 92  | 131 | 56  | 70  | 64  |
| 60 | 30  | 66  | 182 | 163 | 195 | 72  | 126 | 110 | 107 | 58  | 40  | 84  | 250 | 133 | 186 | 61  |
| 70 | 202 | 94  | 155 | 159 | 10  | 21  | 121 | 43  | 78  | 212 | 229 | 172 | 115 | 243 | 167 | 87  |
| 80 | 7   | 112 | 192 | 247 | 140 | 128 | 99  | 13  | 103 | 74  | 222 | 237 | 49  | 197 | 254 | 24  |
| 90 | 227 | 165 | 153 | 119 | 38  | 184 | 180 | 124 | 17  | 68  | 146 | 217 | 35  | 32  | 137 | 46  |
| A0 | 55  | 63  | 209 | 91  | 149 | 188 | 207 | 205 | 144 | 135 | 151 | 178 | 220 | 252 | 190 | 97  |
| B0 | 242 | 86  | 211 | 171 | 20  | 42  | 93  | 158 | 132 | 60  | 57  | 83  | 71  | 109 | 65  | 162 |
| C0 | 31  | 45  | 67  | 216 | 183 | 123 | 164 | 118 | 196 | 23  | 73  | 236 | 127 | 12  | 111 | 246 |
| D0 | 108 | 161 | 59  | 82  | 41  | 157 | 85  | 170 | 251 | 96  | 134 | 177 | 187 | 204 | 62  | 90  |
| E0 | 203 | 89  | 95  | 176 | 156 | 169 | 160 | 81  | 11  | 245 | 22  | 235 | 122 | 117 | 44  | 215 |
| F0 | 79  | 174 | 213 | 233 | 230 | 231 | 173 | 232 | 116 | 214 | 244 | 234 | 168 | 80  | 88  | 175 |

TABLE 2 example error location table

|    | 1   | 2   | 3   | 4   | 5   | 6   | 7   | 8   | 9   |
|----|-----|-----|-----|-----|-----|-----|-----|-----|-----|
| d0 | 199 | 73  | 251 | 242 | 232 | 2   | 165 | 249 | 198 |
| d1 | 70  | 180 | 190 | 93  | 206 | 246 | 60  | 103 | 200 |
| d2 | 79  | 2   | 248 | 238 | 8   | 171 | 0   | 204 | 5   |

TABLE 3 example error correction value table

|     | 0    | 1    | 2    | 3    | 4    | 5    | 6    | 7    | 8    | 9    | 10   | 11   | 12   | 13   | 14   | 15   |
|-----|------|------|------|------|------|------|------|------|------|------|------|------|------|------|------|------|
| 0   | 0x8E | 0x01 | 0x02 | 0x04 | 0x08 | 0x10 | 0x20 | 0x40 | 0x80 | 0x1D | 0x3A | 0x74 | 0xE8 | 0xCD | 0x87 | 0x13 |
| 16  | 0x26 | 0x4C | 0x98 | 0x2D | 0x5A | 0xB4 | 0x75 | 0xEA | 0xC9 | 0x8F | 0x03 | 0x06 | 0x0C | 0x18 | 0x30 | 0x60 |
| 32  | 0xC0 | 0x9D | 0x27 | 0x4E | 0x9C | 0x25 | 0x4A | 0x94 | 0x35 | 0x6A | 0xD4 | 0xB5 | 0x77 | 0xEE | 0xC1 | 0x9F |
| 48  | 0x23 | 0x46 | 0x8C | 0x05 | 0x0A | 0x14 | 0x28 | 0x50 | 0xA0 | 0x5D | 0xBA | 0x69 | 0xD2 | 0xB9 | 0x6F | 0xDE |
| 64  | 0xA1 | 0x5F | 0xBE | 0x61 | 0xC2 | 0x99 | 0x2F | 0x5E | 0xBC | 0x65 | 0xCA | 0x89 | 0x0F | 0x1E | 0x3C | 0x78 |
| 80  | 0xF0 | 0xFD | 0xE7 | 0xD3 | 0xBB | 0x6B | 0xD6 | 0xB1 | 0x7F | 0xFE | 0xE1 | 0xDF | 0xA3 | 0x5B | 0xB6 | 0x71 |
| 96  | 0xE2 | 0xD9 | 0xAF | 0x43 | 0x86 | 0x11 | 0x22 | 0x44 | 0x88 | 0x0D | 0x1A | 0x34 | 0x68 | 0xD0 | 0xBD | 0x67 |
| 112 | 0xCE | 0x81 | 0x1F | 0x3E | 0x7C | 0xF8 | 0xED | 0xC7 | 0x93 | 0x3B | 0x76 | 0xEC | 0xC5 | 0x97 | 0x33 | 0x66 |
| 128 | 0xCC | 0x85 | 0x17 | 0x2E | 0x5C | 0xB8 | 0x6D | 0xDA | 0xA9 | 0x4F | 0x9E | 0x21 | 0x42 | 0x84 | 0x15 | 0x2A |
| 144 | 0x54 | 0xA8 | 0x4D | 0x9A | 0x29 | 0x52 | 0xA4 | 0x55 | 0xAA | 0x49 | 0x92 | 0x39 | 0x72 | 0xE4 | 0xD5 | 0xB7 |
| 160 | 0x73 | 0xE6 | 0xD1 | 0xBF | 0x63 | 0xC6 | 0x91 | 0x3F | 0x7E | 0xFC | 0xE5 | 0xD7 | 0xB3 | 0x7B | 0xF6 | 0xF1 |
| 176 | 0xFF | 0xE3 | 0xDB | 0xAB | 0x4B | 0x96 | 0x31 | 0x62 | 0xC4 | 0x95 | 0x37 | 0x6E | 0xDC | 0xA5 | 0x57 | 0xAE |
| 192 | 0x41 | 0x82 | 0x19 | 0x32 | 0x64 | 0xC8 | 0x8D | 0x07 | 0x0E | 0x1C | 0x38 | 0x70 | 0xE0 | 0xDD | 0xA7 | 0x53 |
| 208 | 0xA6 | 0x51 | 0xA2 | 0x59 | 0xB2 | 0x79 | 0xF2 | 0xF9 | 0xEF | 0xC3 | 0x9B | 0x2B | 0x56 | 0xAC | 0x45 | 0x8A |
| 224 | 0x09 | 0x12 | 0x24 | 0x48 | 0x90 | 0x3D | 0x7A | 0xF4 | 0xF5 | 0xF7 | 0xF3 | 0xFB | 0xEB | 0xCB | 0x8B | 0x0B |
| 240 | 0x16 | 0x2C | 0x58 | 0xB0 | 0x7D | 0xFA | 0xE9 | 0xCF | 0x83 | 0x1B | 0x36 | 0x6C | 0xD8 | 0xAD | 0x47 | 0x8E |

The first addressing unit 110 is communicatively coupled to both the first decision unit 104 and the memory 108 and configured to generate an exponent representation of the first RS syndrome Sxe[0:n–k–1] by searching the logarithm Table 1 if there are less than N symbols in the first RS syndrome Sx[0:n–k–1] that equal 0.

The second adder 112 is communicatively coupled to the first addressing unit 110 and configured to generate at least one subtracted first RS syndrome Sxd[0:n–k–1] by each subsequently subtracting a corresponding one of k groups of error location values in the error location table from the exponent representation of the first RS syndrome Sxe[0:n–k–1].

The second decision unit 114 is communicatively coupled to the second adder 112 and configured to determine whether N symbols in each of the at least one subtracted first RS syndrome Sxd[0:n–k–1] equal each other.

The output port 116 is communicatively coupled to the second decision unit 114 and configured to abandon the decoding and send an error indicator if none of the N symbols in any of k subtracted first RS syndromes Sxd[0:n–k–1] equals each other.

Alternatively, the circuit 100 further comprises a second addressing unit 118, a third decision unit 120, and a third adder 122.

The second decision unit 114 is further configured to determine that the sequence of the subtraction for the subtracted first RS syndrome Sxd[0:n–k–1] which has N symbols equal each other corresponds to an error data symbol location, if the second decision unit 114 determines that N symbols in one of k subtracted first RS syndromes equal each other.

The second addressing unit 118 is communicatively coupled to the second decision unit 114 and configured to retrieve an error bit value corresponding to the error data symbol location by searching the error correction value Table 3 using the value of the N symbols that equal each other.

The third decision unit 120 is communicatively coupled to the second addressing unit 118 and configured to determine whether N+1 symbols in one of the at least one subtracted first RS syndrome equal each other.

The third adder 122 is communicatively coupled to the second addressing unit 118 and configured to generate a corrected received symbol stream by adding the error bit value to the received symbol stream to be decoded u[0:n−1] if N+1 symbols in each of the at least one subtracted first RS syndrome Sxd[0:n−k−1] equal each other.

Alternatively, the circuit 100 further comprises a fourth adder 124, a second RS syndrome generator 126, a fourth decision unit 128 and a fifth adder 130.

The fourth adder 124 is communicatively coupled to the third decision unit 120 and configured to generate a partially corrected received symbol stream by adding the error bit value to the received symbol stream to be decoded u[0:n−1] if only N symbols in each of the at least one subtracted first RS syndrome Sxd[0:n−k−1] equal each other.

The second RS syndrome generator 126 is communicatively coupled to the fourth adder 124 and configured to generate a second RS syndrome Sx'[0:n−k−1] for a RS(n, k) code according to the partially corrected received symbol stream u'[0:n−1], wherein k is the number of data symbols in the partially corrected received symbol stream u'[0:n−1], and n is the total number of code symbols in the partially corrected received symbol stream u'[0:n−1].

The fourth decision unit 128 is communicatively coupled to the second RS syndrome generator 126 and configured to determine whether there are at least N symbols in the second RS syndrome Sx'[0:n−k−1] that equal 0, wherein N is related to code distance of the RS(n, k) code.

The fifth adder 130 is communicatively coupled to the fourth decision unit 128 and configured to output a second corrected decoded codeword by adding the second RS syndrome Sx'[0:n−k−1] to the partially corrected received symbol stream u'[0:n−1].

In an example implementation, n equals 12, k equals 9, that is, a RS(12, 9) code is taken as an example.

Example 1

In an example embodiment, the first RS syndrome generator 102 is configured to generate a first RS syndrome Sx[0:2] for a RS(12, 9) code according to a received symbol stream u[0:11] to be decoded, wherein 9 is the number of data symbols in the received symbol stream to be decoded, and 12 is the total number of code symbols in the received symbol stream to be decoded. Let u=[0x0D, 0x5B, 0x9B, 0xF3, 0x83, 0x6D, 0x33, 0xFC, 0xD4, 0x11, 0x5E, 0xDB]. Suppose the 10th data symbol 0x0E has a consecutive error (error bits are 1~5 bits) and changes to 0x11. Accordingly, the RS syndrome generator 102 obtains the first syndrome Sx[0:2]=[0x31,0,0].

The first decision unit 104 is communicatively coupled to the first RS syndrome generator 102 and configured to determine whether there are at least N symbols in the first RS syndrome Sx[0:2] that equal 0, wherein N is related to code distance of the RS(n, k) code (or corresponds to the maximum error correcting capability of the code). In this example, N equals 2. Accordingly, the first decision unit 104 determines that there are at least two 0s in Sx.

The first adder 106 is communicatively coupled to the first decision unit 104 and configured to output a corrected decoded codeword c by adding the first RS syndrome Sx[0:2] to the received symbol stream u[0:11] to be decoded if there are at least two symbols in the first RS syndrome Sx[0:2] that equal 0. In other words, c=u=u[0:11]+Sx[0:2]. Accordingly, c=u+[0 . . . 0, Sx0 Sx1, Sx2]=u+[0 . . . 0, 0x31, 0, 0]=[0x0D, 0x5B, 0x9B, 0xF3, 0x83, 0x6D, 0x33, 0xFC, 0xD4, 0x0E, 0x5E, 0xDB]. Decoding is completed.

Example 2

The first addressing unit 110 is communicatively coupled to both the first decision unit 104 and the memory 108 and configured to alternatively generate an exponent representation of the first RS syndrome Sxe[0:2] by searching the logarithm Table 1 if there are less than 2 symbols in the first RS syndrome Sx[0:2] that equal 0. In this scenario, Let u=[0x0D, 0x5B, 0xA4, 0xF3, 0x83, 0x6D, 0x33, 0xFC, 0xD4, 0x0E, 0x5E, 0xDB]. Suppose the third data 0x9B has a consecutive error (the error bits are 1~6 bits) and changes to 0xA4. According, the first syndrome generator obtains the syndrome Sx[0:2]=[99,68,230]=[0x63, 0x40, xE6], wherein [99,68,230] are the decimal representations of the syndrome, and the [0x63, 0x40, xE6] are the converted hexadecimal representations of the syndrome. Then the first addressing unit 110 checks the example logarithm Table 1, and gets an exponent representation of the first RS syndrome Sxe=[163, 102,160]. In Table 1, the first column represents the first hexadecimal digit, and the first row represents the second hexadecimal digit. For example, 0x63 addresses to the eighth row (60) and the fifth column (3), which equals to the 163.

The second adder 112 is communicatively coupled to the first addressing unit 110 and configured to generate at least one subtracted first RS syndrome Sxd[0:2] by each subsequently subtracting a corresponding one of k groups of error location values in the error location table from the exponent representation of the first RS syndrome Sxe[0:n−2]. The second decision unit 114 is communicatively coupled to the second adder 112 and configured to determine whether 2 symbols in each of the at least one subtracted first RS syndrome Sxd[0:2] equal each other. For example, the second adder 112 subtracts the first group of error location values [d0, d1, d2]=[199, 70, 79] from Sxe [163,102,160], and obtains a first group of the subtracted first RS syndrome $Sxd_1$[0:2]=[219, 32, 81]. As none of the values in the first group of the subtracted first RS syndrome equals to each other, the second adder 112 continues to perform another group of subtraction. Then the second adder 112 continues to subtract the second group of error location values [d0, d1, d2]=[73, 180, 2] from the exponent representation of the first RS syndrome Sxe [163,102,160] and obtains a second group of the subtracted first RS syndrome $Sxd_2$[0:2]=[90, 177, 155]. As none of the values in the second group of the subtracted first RS syndrome equals to each other, the second adder 112 continues to perform another group of subtraction. Then the second adder 112 continues to subtract the third group of error location values [d0, d1, d2]=[251, 190, 248] from the exponent representation of the first RS syndrome Sxe [163,102,160], and obtains a third group of the subtracted first RS syndrome $Sxd_3$[0:2]=[167, 167, 167]. Note all the error location values can be addressed according to Table 2—example error location table. That is to say, each time, the second adder 112 continues to subtract corresponding error location value from the exponent representation of the first RS syndrome if there are no two values in the previously obtained group of first subtracted RS syndrome equal to each other. Note if the subtracted value is negative, 255 is added to the negative value. The values for groups of subtracted first RS syndrome can be shown in the following Table 4.

TABLE 4

Values for groups of subtracted first RS syndrome for example 2

|  | 1 | 2 | 3 | 4 | 5 | 6 | 7 | 8 | 9 |
|---|---|---|---|---|---|---|---|---|---|
| Sxd0 | 219 | 90 | 167 | * | * | * | * | * | * |
| Sxd1 | 32 | 177 | 167 | * | * | * | * | * | * |
| Sxd2 | 81 | 158 | 167 | * | * | * | * | * | * |

In the above table, the asteroid symbols represent that the calculations are not necessarily performed.

The second decision unit 114 is further configured to determine that the sequence of the subtraction for the subtracted first RS syndrome which has 2 symbols equal to each other corresponds to an error data symbol location, if the second decision unit determines that 2 symbols in one of the at least one (in the example above, 3 to be specific) subtracted first RS syndromes equal each other. The second addressing unit 118 is communicatively coupled to the second decision unit 114 and configured to retrieve an error bit value corresponding to the error data symbol location by searching the error correction value table using the value of the 2 symbols that equal each other. For example, the second decision unit 114 determines that the sequence of the subtraction for the subtracted first RS syndrome which has 2 symbols equal each other, meaning the third subtraction, corresponds to an error data symbol location. In other words, the second decision unit 114 determines that the third data symbol has an error, and retrieves an error bit value of 0x3F according to Table 3—example error correction value table, using the same value 167 in the subtracted first RS syndrome $Sxd_3[0:2]=[167, 167, 167]$.

The third decision unit 120 is communicatively coupled to the second addressing unit 118 and configured to determine whether N+1 (or 3 to be specific) symbols in the one of the 3 subtracted first RS syndrome equal each other. Accordingly, the third decision unit 120 determines that 3 symbols in the $Sxd_3[0:2]=[167, 167, 167]$ equal to each other.

The third adder 122 is communicatively coupled to the second decision unit 120 and configured to generate a corrected received symbol stream by adding the error bit value to the received symbol stream to be decoded if 3 symbols in the one of the at least one subtracted first RS syndrome equal each other. Accordingly, the third adder 122 obtains the corrected third data symbol by adding 0x3F to 0xA4, to obtain 0x9B. Accordingly, c=u+[0, 0, 0xA4, 0,0 . . . 0]=[0x0D, 0x5B, 0x9B, 0xF3, 0x83, 0x6D, 0x33, 0xFC, 0xD4, 0x0E, 0x5E, 0xDB]. The error correction is completed.

Example 3

In addition to the first RS syndrome generator 102, the first decision unit 104, the memory 108, the first addressing unit 110, the second adder 112, the second decision unit 114, second addressing unit 118, third decision unit 120, and third adder 122, the circuit 100 further comprises a fourth adder 128, and a fifth adder 130.

The first addressing unit 110 is communicatively coupled to both the first decision unit 104 and the memory 108 and configured to generate an exponent representation of the first RS syndrome Sxe[0:2] by searching the logarithm Table 1, if there are less than 2 symbols in the first RS syndrome Sx[0:2] that equal 0. In this scenario, Let u=[0x0D, 0x5B, 0xA4, 0xF3, 0x83, 0x6D, 0x33, 0xFC, 0xD4, 0x0E, 0x5E, 0x24]. Suppose the third data 0x9B has a consecutive error (the error bits are 1~6 bits) and changes to 0xA4, and the twelfth data 0xDB has a consecutive error (the error bits are 1~8 bits) and changes to 0x24. According, the first syndrome generator obtains the syndrome Sx[0:2]=[99, 68, 25]=[0x63, 0x44, 0x19], wherein [99,68,25] are the decimal representations of the syndrome, and the [0x63, 0x44, 0x19] are the converted hexadecimal representations of the syndrome. Then the first addressing unit 110 checks the example logarithm Table 1, and gets Sxe=[163,102,193]. In Table 1, the first column represents the first hexadecimal digit, and the first row represents the second hexadecimal digit. For example, 0x63 addresses to the eight row (60) and the fifth column (3), which equals to the 163.

The second adder 112 is communicatively coupled to the first addressing unit 110 and configured to generate at least one subtracted first RS syndrome Sxd[0:2] by each subsequently subtracting a corresponding one of k groups of error location values in the error location table from the exponent representation of the first RS syndrome Sxe[0:n−2]. The second decision unit 114 is communicatively coupled to the second adder 112 and configured to determine whether 2 symbols in each of the at least one subtracted first RS syndrome Sxd[0:2] equal each other. Accordingly, the second adder 112 subtracts the first group of error location values [d0, d1, d2]=[199, 70, 79] from Sxe [163,102,193], and obtains a first group of the subtracted first RS syndrome $Sxd_1[0:2]=[219, 32, 114]$. As none of the values in the first group of the subtracted first RS syndrome equals to each other, the second adder 112 continues to perform another group of subtraction. Then the second adder 112 continues to subtract the second group of error location values [d0, d1, d2]=[73, 180, 2] from the exponent representation of the first RS syndrome Sxe [163,102,193] and obtains a second group of the subtracted first RS syndrome $Sxd_2[0:2]=[90, 177, 191]$. As none of the values in the second group of the subtracted first RS syndrome equals to each other, the second adder 112 continues to perform another group of subtraction. Then the second adder 112 continues to subtract the third group of error location values [d0, d1, d2]=[251, 190, 248] from the exponent representation of the first RS syndrome Sxe [163,102, 193], and obtains a third group of the subtracted first RS syndrome $Sxd_3[0:2]=[167, 167, 200]$. Note all the error location values can be addressed according to Table 2—example error location table. That is to say, each time, the second adder 112 continues to subtract corresponding error location value from the exponent representation of the first RS syndrome if there are no two values in the previously obtained group of first subtracted RS syndrome equal to each other. Note if the subtracted value is negative, 255 is added to the negative value. The values for groups of subtracted first RS syndrome can be shown in the following Table 5.

TABLE 5

Values for groups of subtracted first RS syndrome for example 2

|  | 1 | 2 | 3 | 4 | 5 | 6 | 7 | 8 | 9 |
|---|---|---|---|---|---|---|---|---|---|
| Sxd0 | 219 | 90 | 167 | * | * | * | * | * | * |
| Sxd1 | 32 | 177 | 167 | * | * | * | * | * | * |
| Sxd2 | 114 | 191 | 200 | * | * | * | * | * | * |

In the above Table 5, the asteroid symbols represent that the calculations are not necessarily performed.

The fourth adder 124 is communicatively coupled to the third decision unit 120 and configured to generate a partially corrected received symbol stream by adding the error bit value to the received symbol stream to be decoded if only N symbols in each of the at least one subtracted first RS syndrome equal each other. For example, in the third group of subtraction, the fourth adder 124 found that the two values in the Sxd Sxd$_3$[0:2]=[167, 167, 200] are the same, and both of them are 167. At this time, the third decision unit 120 decides that the third symbol is incorrect. Further, since the different value in the Sxd is the third Sxd2, the third decision unit 120 can conclude that the third parity symbol, that is, the 12th symbol of the received symbol stream u, also has an error. According to the value 167, the third decision unit 120 checks the error correction value table 3, and obtains the error bit is 0x3F, i.e., the lower 6 bit. Therefore, the fourth adder 124 adds 0x3F to 0xA4 of the third data symbol in a modulo 2 manner, to obtain 0x9B. The error correction for the third data symbol is successful. Therefore the fourth adder 124 obtains the partially corrected received symbol stream [0x0D, 0x5B, 0x9B, 0xF3, 0x83, 0x6D, 0x33, 0xFC, 0xD4, 0x0E, 0x5E, 0x24].

Then, a second RS syndrome generator 126 is communicatively coupled to the fourth adder 124, and configured to generate a second RS syndrome for a RS(n, k) code according to the partially corrected received symbol stream, wherein k is the number of data symbols in the partially corrected received symbol stream, and n is the total number of code symbols in the partially corrected received symbol stream. For example, the second RS syndrome generator 126 recalculate the RS syndromes to get the second RS syndrome Sx'=[0, 0, FF].

The fourth decision unit 128 is communicatively coupled to the second RS syndrome generator 126 and configured to determine whether there are at least N symbols in the second RS syndrome that equal 0, wherein N is related to code distance of the RS(n, k) code. In the above case, the fourth decision unit 128 decides there are 2 symbols equal 0.

The fifth adder 130 is communicatively coupled to the fourth decision unit 128 and configured to output a second corrected decoded codeword by adding the second RS syndrome to the partially corrected received symbol stream. Therefore, the fifth adder 130 adds [0, 0, FF] to the partially corrected received symbol stream [0x0D, 0x5B, 0x9B, 0xF3, 0x83, 0x6D, 0x33, 0xFC, 0xD4, 0x0E, 0x5E, 0x24] in a modulo 2 manner, and obtains the second corrected decoded codeword [0x0D, 0x5B, 0x9B, 0xF3, 0x83, 0x6D, 0x33, 0xFC, 0xD4, 0x0E, 0x5E, 0xDB]. Therefore, the decoding is completed.

Example 4

The first addressing unit 110 is communicatively coupled to both the first decision unit 104 and the memory 108 and configured to alternatively generate an exponent representation of the first RS syndrome Sxe[0:2] by searching the logarithm Table 1 if there are less than 2 symbols in the first RS syndrome Sx[0:2] that equal 0. In this scenario, Let u=[0x0D, 0x5B, 0xA4, 0xF3, 0x83, 0x6E, 0x33, 0xFC, 0xD4, 0x0E, 0x5E, 0xDB]. That is, the third data symbol 0x9B has a consecutive error (bits 1 to 6), and changes to 0xA4, and the sixth data 0x6D has a consecutive error (bits 1 to 2) and changes to 0x6E. According, the first syndrome generator obtains the syndrome Sx[0:2]=[123, 220, 107]= [0x7B,0xDC,0x6B], wherein [123, 220, 107] are the decimal representations of the syndrome, and the [0x7B,0xDC, 0x6B] are the converted hexadecimal representations of the syndrome. Then the first addressing unit 110 checks the example logarithm Table 1, and gets Sxe=[172,187,84]. In Table 1, the first column represents the first hexadecimal digit, and the first row represents the second hexadecimal digit. For example, 0x7B addresses to the ninth row (70) and the thirteenth column (B), which equals to the 172.

The second adder 112 is communicatively coupled to the first addressing unit 110 and configured to generate at least one subtracted first RS syndrome Sxd[0:2] by each subsequently subtracting a corresponding one of k groups of error location values in the error location table from the exponent representation of the first RS syndrome Sxe[0:n−2]. The second decision unit 114 is communicatively coupled to the second adder 112 and configured to determine whether 2 symbols in each of the at least one subtracted first RS syndrome Sxd[0:2] equal each other. Accordingly, the second adder 112 subtract the first group of error location values [d0, d1, d2]=[199, 70, 79] from the exponent representation of the first RS syndrome Sxe [172,187,84], and obtains a first group of the subtracted first RS syndrome Sxd$_1$[0:2]= [228, 117, 5]. As none of the values in the first group of the subtracted first RS syndrome equals to each other, the second adder 112 continues to perform another group of subtraction. Then the second adder 112 continues to subtract the second group of error location values [d0, d1, d2]=[73, 180, 2] from the exponent representation of the first RS syndrome Sxe [172,187,84], and obtains a second group of the subtracted first RS syndrome Sxd$_2$[0:2]=[99, 7, 82]. As none of the values in the second group of the subtracted first RS syndrome equals to each other, the second adder 112 continues to perform another group of subtraction. Then the second adder 112 continues to subtract the third group of error location values [d0, d1, d2]=[251, 190, 248] from the exponent representation of the first RS syndrome Sxe [172, 187,84], and obtains a third group of the subtracted first RS syndrome Sxd$_3$[0:2]=[176, 252, 91]. The second adder 112 continues until all nine times subtractions have been completed, and the second adder 112 obtains the ninth group of the subtracted first RS syndrome Sxd$_9$[0:2]=[229, 242, 79] by subtracting the ninth group of error location values [d0, d1, d2]=[198, 200, 5] from the exponent representation of the first RS syndrome Sxe [172,187,84]. The values for groups of subtracted first RS syndrome can be shown in the following Table 6.

TABLE 6 values for groups of subtracted first RS syndrome for example 4

|      | 1   | 2  | 3   | 4   | 5   | 6   | 7   | 8   | 9   |
|------|-----|----|-----|-----|-----|-----|-----|-----|-----|
| Sxd0 | 228 | 99 | 176 | 185 | 195 | 170 | 7   | 178 | 229 |
| Sxd1 | 117 | 7  | 252 | 94  | 236 | 196 | 127 | 84  | 242 |
| Sxd2 | 5   | 82 | 91  | 101 | 76  | 168 | 84  | 135 | 79  |

After 9 groups of subtractions, the same Sxd value still does not appear. At this point, the decoding process exits, and the output port 116 reports that there is no solution for the decoding, and reports incorrect decoding, and abandon the decoding.

Figure 2:
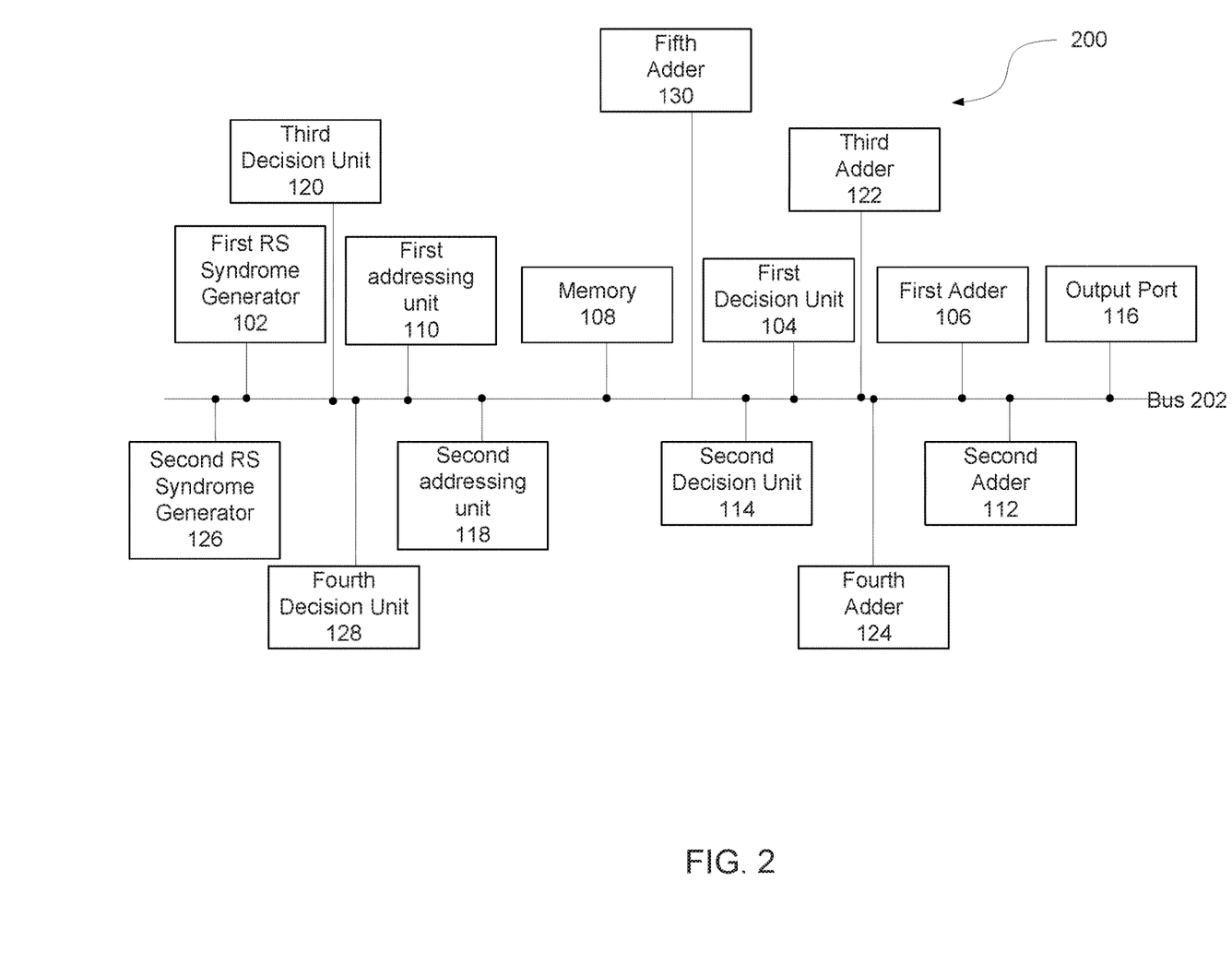
FIG. 2 a circuit diagram of a circuit for error correction according to another embodiment of the invention.

FIG. 2 is a circuit diagram of an error correction circuit 200 according to another embodiment of the invention. Unlike in circuit 100, the circuit elements of the error correction circuit 200 are all connected via a bus 202.

Figure 3:
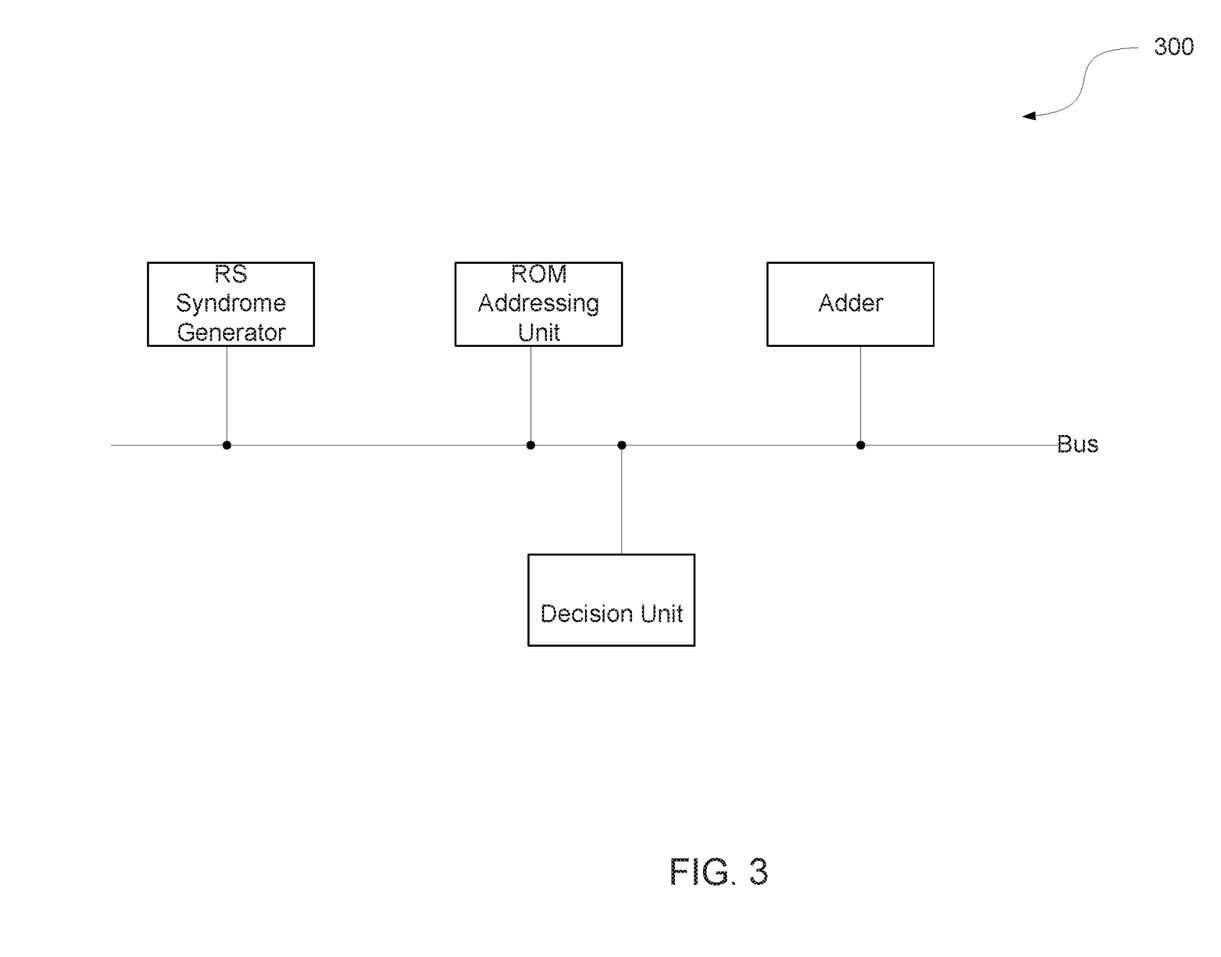
FIG. 3 a circuit diagram of a circuit for error correction according to another embodiment of the invention.

FIG. 3 is a circuit diagram of an error correction circuit 300 according to another embodiment of the invention. Unlike in circuit 100, the circuit elements of the error correction circuit 300 are all connected via a bus 202. Unlike in FIG. 2 wherein a plurality of RS syndrome generators, a plurality of adders, a plurality of addressing units and a plurality of decision units are shown, FIG. 3 only shows each element in one. Note whether these elements are reused depend on whether the logic and time cost are sacrificed in exchange or circuit area.

Figure 4:
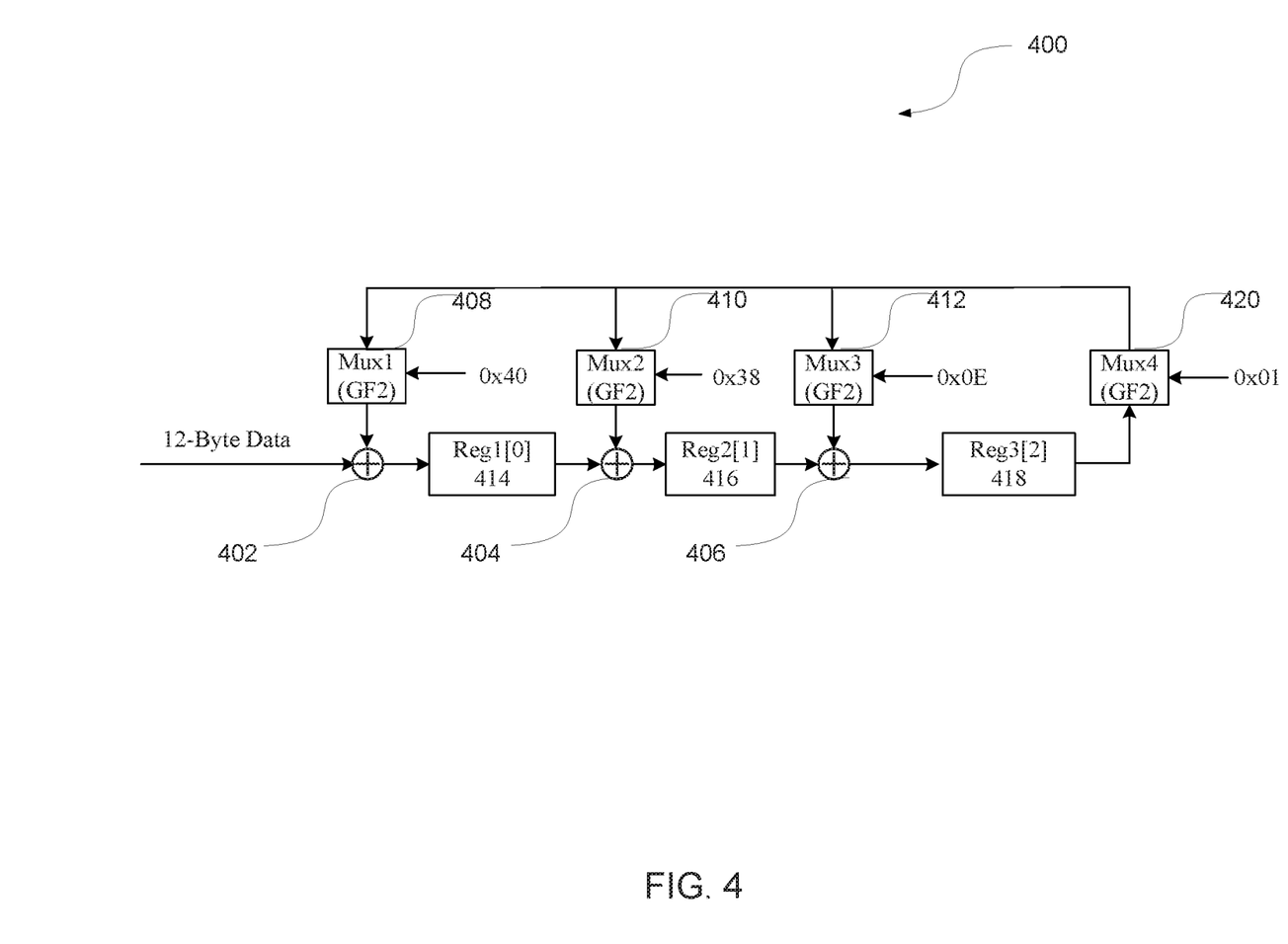
FIG. 4 is a circuit diagram of a circuit for a RS syndrome generator according to an embodiment of the invention.

FIG. 4 is a circuit diagram of a RS syndrome generator 400 according to an embodiment of the invention. Note for the RS syndrome generator, its generator polynomial can be expressed as $g(x)=x^3+0E_h x^2+38_h x+40_h$. The structure of the RS syndrome generator 400 will be discussed below.

The first RS syndrome generator 400 comprises a sixth adder 402 communicatively coupled to a first multiplexer 408 and a first register 414 and configured to output a first symbol stream to the first register 414 by adding a 12-byte received symbol stream to be decoded to an output of the first multiplexer 408; a seventh adder 404 communicatively coupled to the first register 414, a second register 416, and a second multiplexer 410 and configured to output a second symbol stream to the second register 416 by adding the first symbol stream to an output of the second multiplexer 410; an eighth adder 406 communicatively coupled to the second register 416, a third register 418, and a third multiplexer 412 and configured to output a third symbol stream to the third register by adding the second symbol stream to an output of the third multiplexer 412; a fourth multiplexer 420 communicatively coupled to the third register 418, the first multiplexer 408, the second multiplex 410 and the third multiplexer 412, and configured to output a fourth symbol stream based on the third symbol stream to each of the first multiplexer 408, the second multiplex 410 and the third multiplexer 412. Note according to the generator polynomial, the first multiplexer also receives the input of 0x40, the second multiplexer also receives the input of 0x38, the third multiplexer also receives the input of 0x0E, the fourth multiplexer also receives the input of 0x01, and these numbers respectively correspond to the coefficient of the generator polynomial. Note each of the first, second, and third registers Reg1[0], Reg2[1] and Reg3[2] stores the syndrome values Sx1-Sx3, and the values can be read out after 12 clocks.

Alternatively, the RS syndrome generator further comprises a memory storing a logarithm table and an exponent table, wherein each of the first multiplexer 408, the second multiplex 410, the third multiplexer 412, and the fourth multiplexer 420 further comprises a first input port configured to receive a first input; a second input port configured to receive a second input; and an output port configured to output an output signal by generating a sum by adding an exponent representation of the first input and an exponent representation of the second input, wherein exponent representation of the first input and the exponent representation of the second input are obtained by searching the logarithm table; generating a modulo value by modulo the sum by 255; and converting the modulo value to a polynomial representation by searching the exponent table.

To be specific, each of the first, second, third and fourth multiplexers perform the following operation: $Mux(\alpha, \beta)=E((\Lambda(\alpha)+\Lambda(\beta))M(255))$.

Wherein Λ represents searching the logarithm table which is illustrated as table 1, and converting the value to an exponent representation. E represents searching the exponent table 7 below, and convert the value back to a polynomial representation. M represents modulo operation.

TABLE 7 exponent table

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 1 | 2 | 4 | 8 | 10 | 20 | 40 | 80 | 1D | 3A | 74 | E8 | CD | 87 | 13 | 26 |
| 16 | 4C | 98 | 2D | 5A | B4 | 75 | EA | C9 | 8F | 03 | 06 | 0C | 18 | 30 | 60 | C0 |
| 32 | 9D | 27 | 4E | 9C | 25 | 4A | 94 | 35 | 6A | D4 | B5 | 77 | EE | C1 | 9F | 23 |
| 48 | 46 | 8C | 05 | 0A | 14 | 28 | 50 | A0 | 5D | BA | 69 | D2 | B9 | 6F | DE | A1 |
| 64 | 5F | BE | 61 | C2 | 99 | 2F | 5E | BC | 65 | CA | 89 | 0F | 1E | 3C | 78 | F0 |
| 80 | FD | E7 | D3 | BB | 6B | D6 | B1 | 7F | FE | E1 | DF | A3 | 5B | B6 | 71 | E2 |
| 96 | D9 | AF | 43 | 86 | 11 | 22 | 44 | 88 | 0D | 1A | 34 | 68 | D0 | BD | 67 | CE |
| 112 | 81 | 1F | 3E | 7C | F8 | ED | C7 | 93 | 3B | 76 | EC | C5 | 97 | 33 | 66 | CC |
| 128 | 85 | 17 | 2E | 5C | B8 | 6D | DA | A9 | 4F | 9E | 21 | 42 | 84 | 15 | 2A | 54 |
| 144 | A8 | 4D | 9A | 29 | 52 | A4 | 55 | AA | 49 | 92 | 39 | 72 | E4 | D5 | B7 | 73 |
| 160 | E6 | D1 | BF | 63 | C6 | 91 | 3F | 7E | FC | E5 | D7 | B3 | 7B | F6 | F1 | FF |
| 176 | E3 | DB | AB | 4B | 96 | 31 | 62 | C4 | 95 | 37 | 6E | DC | A5 | 57 | AE | 41 |
| 192 | 82 | 19 | 32 | 64 | C8 | 8D | 07 | 0E | 1C | 38 | 70 | E0 | DD | A7 | 53 | A6 |
| 208 | 51 | A2 | 59 | B2 | 79 | F2 | F9 | EF | C3 | 9B | 2B | 56 | AC | 45 | 8A | 09 |
| 224 | 12 | 24 | 48 | 90 | 3D | 7A | F4 | F5 | F7 | F3 | FB | EB | CB | 8B | 0B | 16 |
| 240 | 2C | 58 | B0 | 7D | FA | E9 | CF | 83 | 1B | 36 | 6C | D8 | AD | 47 | 8E | 01 |

As discussed above, the RS code decoding further includes error symbol correction. After obtaining the syndrome Sx, the circuit further determines if there is any error in the code. If the Sx has error(s), the circuit queries error location table to determine whether the error in the error location is correctable. If the error is correctable, the circuit further queries the error correction value table to correct the error, finally the circuit outputs codeword.

At least some of the embodiments have the following advantages: A) According to at least one embodiment, for the shortened RS code, the error correction value codebook does not appear to be very large (since the GF(2^8) conversion itself requires a large conversion table).

B) In contrast to conventional methods for decoding RS codes, which use complicated logic for digital circuits that still require a certain table (e.g. GF(2)), the embodiments do not need complicated logic.

C) In contrast to conventional methods which determine the errors by using whether the matrix formed by the syndromes (e.g., S1, S2; S2, S3) is a singular matrix, that will mistakenly kill (determine as uncorrectable) a situation that both the data symbol and the parity symbol have one error, the embodiments of the present invention can correct this situation, thereby increasing coding gain.

D) Alternatively, the embodiments are advantageously applicable to RS codes with GF(2^N) N<=8.

Figure 5:
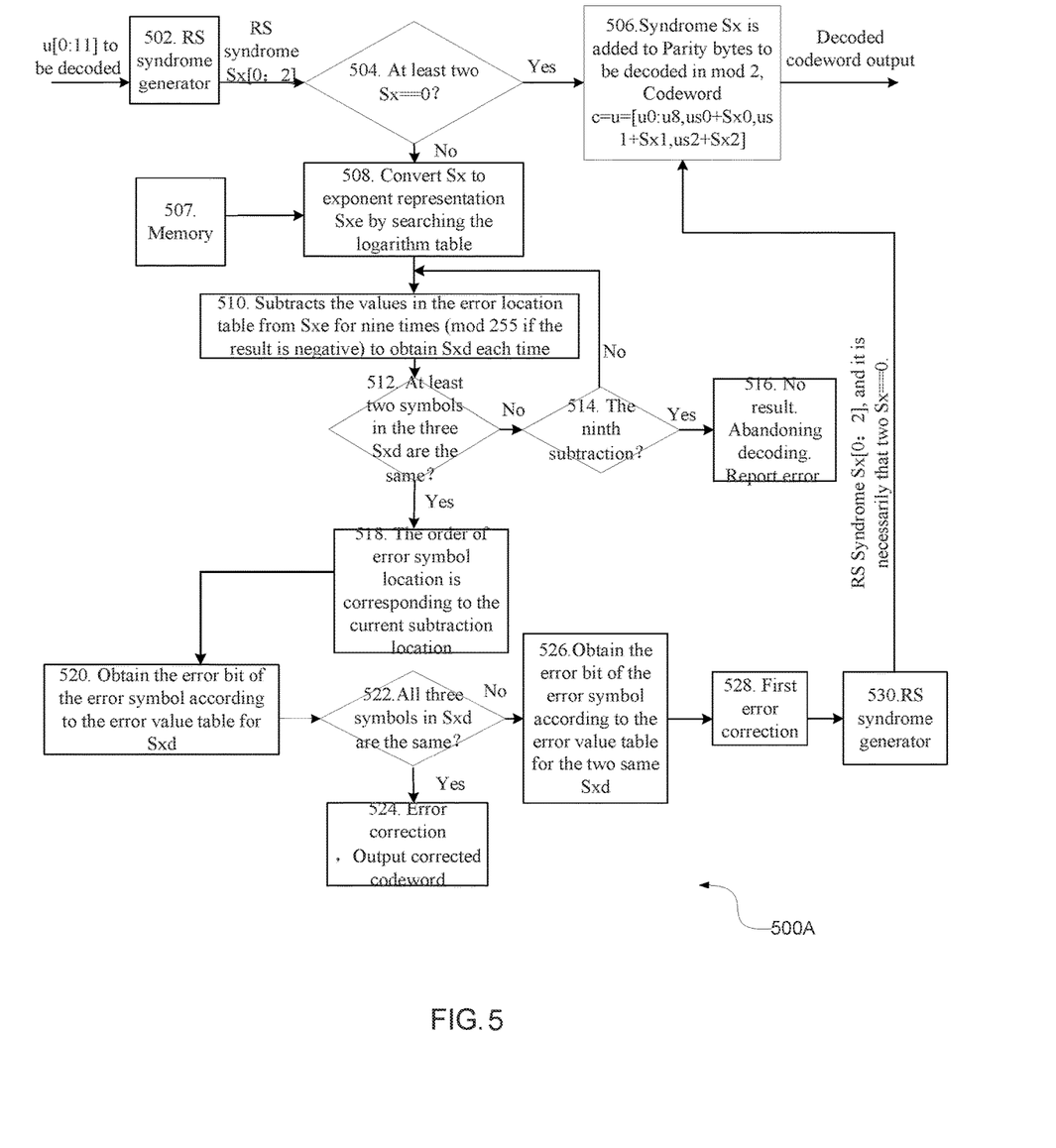
FIG. 5 is a flow chart illustrating a method for error correction according to an embodiment of the invention.

FIG. 5 is a flow chart illustrating a method 500A for error correction according to an embodiment of the invention.

The method 500A for error correction comprises generating in block 502, by a first Reed-Solomon (RS) syndrome generator, a first RS syndrome, for example, Sx[0:2] for a RS(n, k) code according to a received symbol stream to be decoded, wherein k is the number of data symbols in the received symbol stream to be decoded, and n is the total number of code symbols in the received symbol stream to be decoded; determining in block 504, by a first decision unit communicatively coupled to the first RS syndrome generator, whether there are at least N symbols in the first RS syndrome that equal 0, wherein N is related to a code distance of the RS(n, k) code, for example, N=2; and outputting in block 506, by a first adder communicatively coupled to the first decision unit, a corrected decoded codeword by adding the first RS syndrome to the received symbol stream to be decoded if there are at least N symbols in the first RS syndrome that equal 0.

Alternatively, the method 500A further comprises storing in block 507, a logarithm table, an error location table and an error correction value table in a memory; generating in block 508, by a first addressing unit communicatively coupled to both the first decision unit and the memory, an exponent representation of the first RS syndrome Sx by searching the logarithm table if there are less than N symbols in the first RS syndrome that equal 0; generating in block 510, by a second adder communicatively coupled to the first addressing unit, at least one subtracted first RS syndrome by each subsequently subtracting a corresponding one of k (for example, k equals 9) groups of error location values in the error location table from the exponent representation of the first RS syndrome; determining in block 512, by a second decision unit communicatively coupled to the second adder, whether N symbols in any of the at least one subtracted first RS syndrome equal each other; and abandoning in blocks 516, by an output port communicatively coupled to the second decision unit, the decoding and send an error indicator if none of the N symbols in any of k subtracted first RS syndromes equal each other as determined in block 514.

Alternatively, the method 500A further comprises determining in block 518, by the second decision unit, that the sequence of the subtraction for the subtracted RS which has N symbols equal each other corresponds to an error data symbol location, if the second decision unit determines that N symbols in one of k subtracted first RS syndromes equal each other; and retrieving in block 520, by a second addressing unit communicatively coupled to the second decision unit, an error bit value corresponding to the error data symbol location by searching the error correction value table using the value of the N symbols that equal each other; determining in block 522, by a third decision unit communicatively coupled to the second addressing unit, whether N+1 symbols in one of the at least one subtracted first RS syndrome Sx equal each other; and generating in block 524, by a third adder communicatively coupled to the second addressing unit, a corrected received symbol stream by adding the error bit value to the received symbol stream to be decoded if N+1 symbols in each of the at least one subtracted first RS syndrome equal each other.

Alternatively, the method 500A further comprises generating in block 526 and 528, by a fourth adder communicatively coupled to the third decision unit, a partially corrected received symbol stream by adding the error bit value to the received symbol stream to be decoded if only N symbols in each of the at least one subtracted first RS syndrome equal each other; generating in block 528, by a second RS syndrome generator, a second RS syndrome for a RS(n, k) code according to the partially corrected received symbol stream, wherein k is the number of data symbols in the partially corrected received symbol stream, and n is the total number of code symbols in the partially corrected received symbol stream; determining in block 530, by a fourth decision unit communicatively coupled to the second RS syndrome generator, whether there are at least N symbols in the second RS syndrome that equal 0, wherein N is related to a code distance of the RS(n, k) code; and outputting back to block 506, by a fifth adder communicatively coupled to the fourth decision unit, a second corrected decoded codeword by adding the second RS syndrome to the partially corrected received symbol stream.

Figure 6:
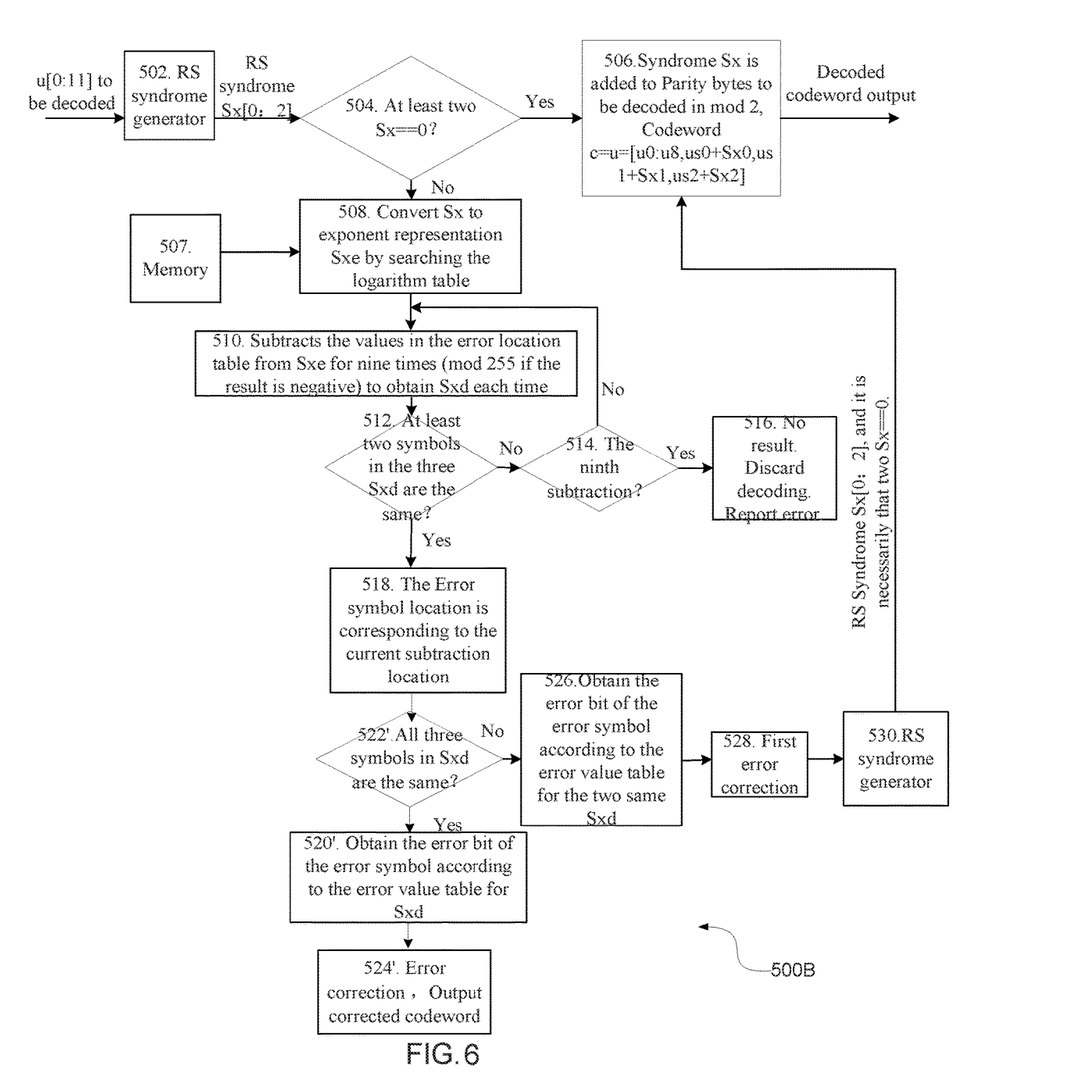
FIG. 6 is a flow chart illustrating a method for error correction according to another embodiment of the invention.

Alternatively, some of the blocks illustrated in FIG. 5 may be performed in parallel, or take other orders instead of the orders shown in FIG. 5. For example, FIG. 6 shows a flow chart illustrating a method 500B for error correction according to another embodiment of the invention. Unlike in FIG. 5, after block 518, the method 500B further comprises determining in block 522', by a third decision unit communicatively coupled to the second addressing unit, whether N+1 symbols in one of the at least one subtracted first RS syndrome Sx equal each other; retrieving in block 520', by a second addressing unit communicatively coupled to the second decision unit, an error bit value corresponding to the error data symbol location by searching the error correction value table using the value of the N symbols that equal each other if all N+1 symbols in one of the at least one subtracted first RS syndrome Sx equal each other; and generating in block 524', by a third adder communicatively coupled to the second addressing unit, a corrected received symbol stream by adding the error bit value to the received symbol stream to be decoded.

Figure 7:
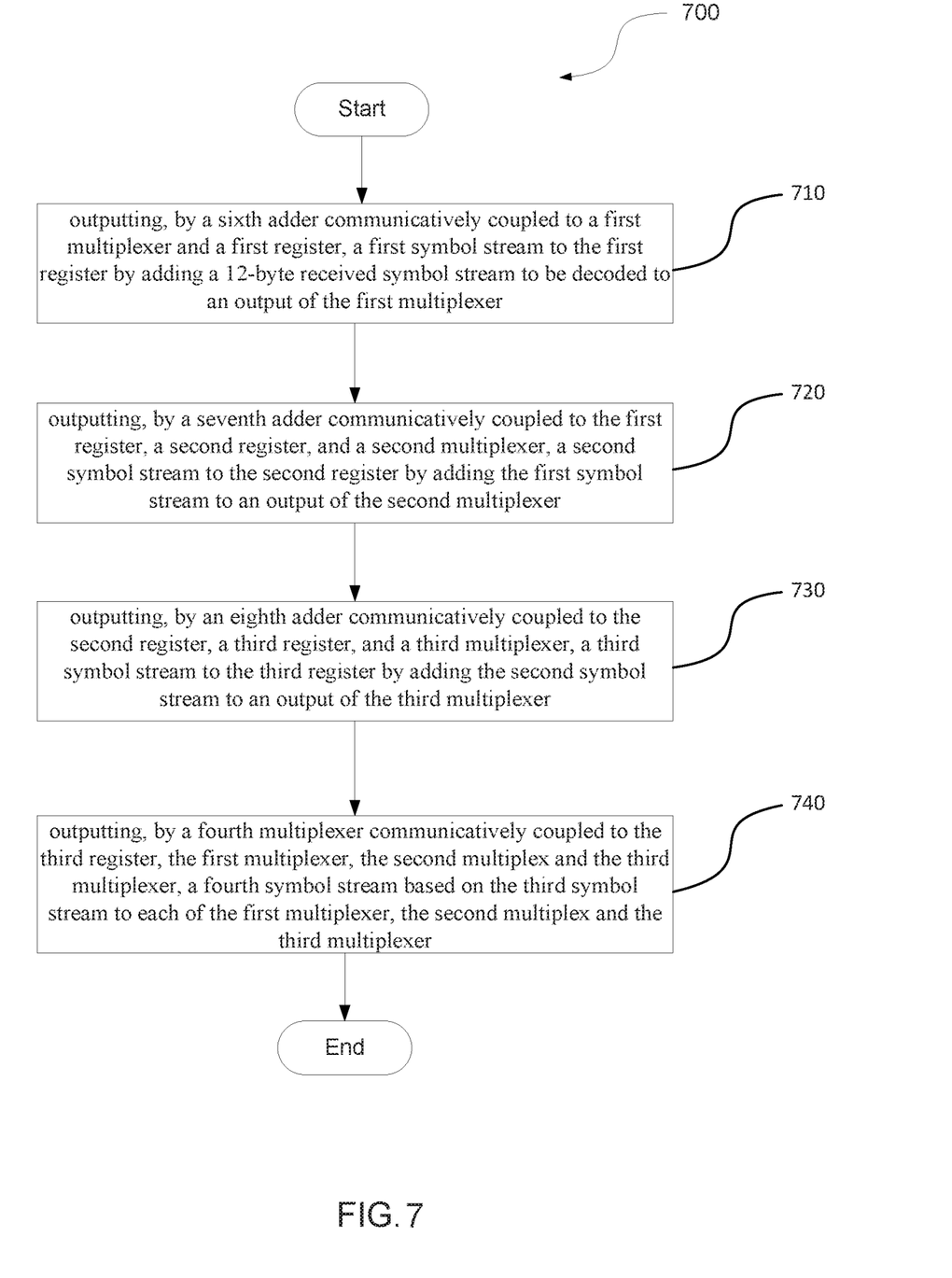
FIG. 7 is a flow chart illustrating a method for generating, by the first RS syndrome generator, a first RS syndrome according to an embodiment of the invention.

FIG. 7 is a flow chart illustrating a method 700 for generating, by the first RS syndrome generator, a first RS syndrome according to an embodiment of the invention.

Alternatively, n equals 12, k equals 9, and N equals 2, and generating in method 700, by the first RS syndrome generator, a first RS syndrome for a RS(n, k) code according to a received symbol stream to be decoded further comprises: outputting in block 710, by a sixth adder communicatively coupled to a first multiplexer and a first register, a first symbol stream to the first register by adding a 12-byte received symbol stream to be decoded to an output of the first multiplexer; outputting in block 720, by a seventh adder communicatively coupled to the first register, a second register, and a second multiplexer, a second symbol stream to the second register by adding the first symbol stream to an output of the second multiplexer; outputting in block 730, by an eighth adder communicatively coupled to the second register, a third register, and a third multiplexer, a third symbol stream to the third register by adding the second symbol stream to an output of the third multiplexer; outputting in block 740, by a fourth multiplexer communicatively coupled to the third register, the first multiplexer, the second multiplex and the third multiplexer, a fourth symbol stream based on the third symbol stream to each of the first multiplexer, the second multiplex and the third multiplexer.

Figure 8:
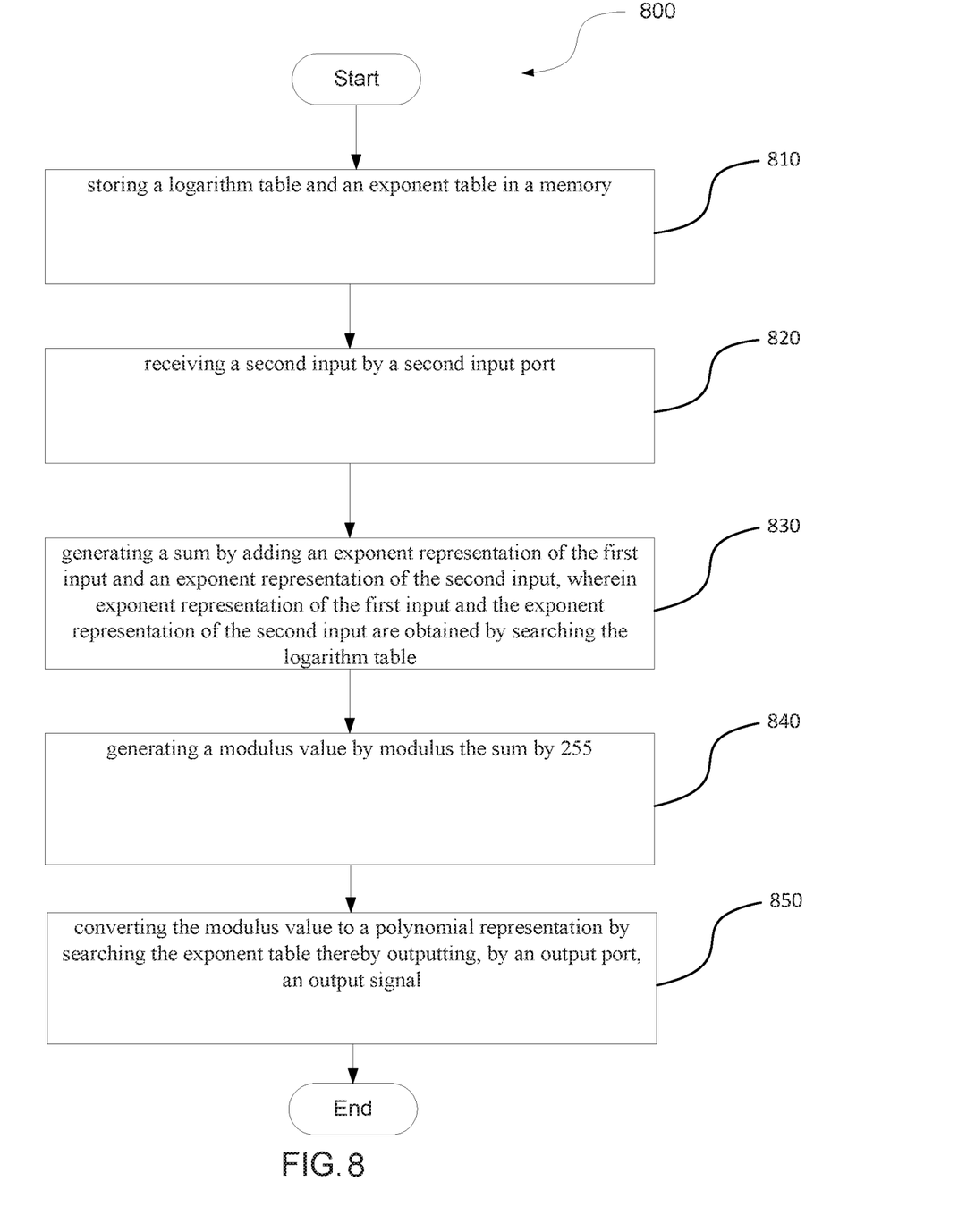
FIG. 8 is a flow chart illustrating a method for operating the multiplexer according to an embodiment of the invention.

FIG. 8 is a flow chart illustrating a method 800 for operating the multiplexer according to an embodiment of the invention.

The method 800 further comprises storing in block 810, a logarithm table and an exponent table in a memory; receiving, in block 820, a second input by a second input port; generating, in block 830, a sum by adding an exponent representation of the first input and an exponent representation of the second input, wherein exponent representation of the first input and the exponent representation of the second input are obtained by searching the logarithm table; generating in block 840, a modulo value by modulo the sum by 255; and converting in block 850, the modulo value to a polynomial representation by searching the exponent table to output by an output port, an output signal.

At least an embodiment achieves the effect to be capable of determining whether an RS(12,9) code word has an error symbol, and determining whether the error is correctable, and finding the location of the error symbol of the RS(12,9) code word in the DMR, which may reduce implementation time and ASIC implementation costs. At least another embodiment achieves the effect to correct an error symbol and determine forward error correction (FEC) after determining an error exists and finding a location of an error symbol.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A circuit for error correction, comprising:
    a first Reed-Solomon (RS) syndrome generator, configured to generate a first RS syndrome for a RS(n, k) code according to a received symbol stream to be decoded, wherein k is the number of data symbols in the received symbol stream to be decoded, and n is the total number of code symbols in the received symbol stream to be decoded;
    a first decision unit communicatively coupled to the first RS syndrome generator and configured to determine whether there are at least N symbols in the first RS syndrome that equal 0, wherein N is related to code distance of the RS(n, k) code;
    a first adder communicatively coupled to the first decision unit and configured to output a corrected decoded codeword by adding the first RS syndrome to the received symbol stream to be decoded if there are at least N symbols in the first RS syndrome that equal;
    a memory storing a logarithm table, an error location table and an error correction value table;
    a first addressing unit communicatively coupled to both the first decision unit and the memory and configured to generate an exponent representation of the first RS syndrome by searching the logarithm table if there are less than N symbols in the first RS syndrome that equal 0;
    a second adder communicatively coupled to the first addressing unit and configured to generate at least one subtracted first RS syndrome by each subsequently subtracting a corresponding one of k groups of error location values in the error location table from the exponent representation of the first RS syndrome;
    a second decision unit communicatively coupled to the second adder and configured to determine whether N symbols in one of the at least one subtracted first RS syndrome equal each other; and
    an output port communicatively coupled to the second decision unit and configured to abandon the decoding and send an error indicator if none of the N symbols in any of k subtracted first RS syndromes equals each other.

2. The circuit according to claim 1, wherein
    the second decision unit is further configured to determine that the sequence of the subtraction for the subtracted first RS syndrome which has N symbols equal each other corresponds to an error data symbol location, if the second decision unit determines that N symbols in one of the at least one subtracted first RS syndromes equal each other; and
    wherein the circuit further comprises:
    a second addressing unit communicatively coupled to the second decision unit and configured to retrieve an error bit value corresponding to the error data symbol location by searching the error correction value table using the value of the N symbols that equal each other;
    a third decision unit communicatively coupled to the second addressing unit and configured to determine whether N+1 symbols in the one of the at least one subtracted first RS syndrome equal each other; and
    a third adder communicatively coupled to the second decision unit and configured to generate a corrected received symbol stream by adding the error bit value to the received symbol stream to be decoded if N+1 symbols in one of the at least one subtracted first RS syndrome equal each other.

3. The circuit according to claim 2, further comprising:
    a fourth adder communicatively coupled to the third decision unit and configured to generate a partially corrected received symbol stream by adding the error bit value to the received symbol stream to be decoded if only N symbols in each of the at least one subtracted first RS syndrome equal each other;
    a second RS syndrome generator communicatively coupled to the fourth adder, and configured to generate a second RS syndrome for a second RS $(n_2, k_2)$ code according to the partially corrected received symbol stream, wherein $k_2$ is the number of data symbols in the partially corrected received symbol stream, and $n_2$ is the total number of code symbols in the partially corrected received symbol stream;
    a fourth decision unit communicatively coupled to the second RS syndrome generator and configured to determine whether there are at least $N_2$ symbols in the second RS syndrome that equal 0, wherein $N_2$ is related to code distance of the second RS $(n_2, k_2)$ code; and
    a fifth adder communicatively coupled to the fourth decision unit and configured to output a second corrected decoded codeword by adding the second RS syndrome to the partially corrected received symbol stream.

4. The circuit of claim 3, wherein $n_2$ equals 12, $k_2$ equals 9, and $N_2$ equals 2;
    wherein the first RS syndrome generator further comprises
    a sixth adder communicatively coupled to a first multiplexer and a first register and configured to output a first symbol stream to the first register by adding a 12-byte received symbol stream to be decoded to an output of the first multiplexer;
    a seventh adder communicatively coupled to the first register, a second register, and a second multiplexer and configured to output a second symbol stream to the second register by adding the first symbol stream to an output of the second multiplexer;

an eighth adder communicatively coupled to the second register, a third register, and a third multiplexer and configured to output a third symbol stream to the third register by adding the second symbol stream to an output of the third multiplexer;

a fourth multiplexer communicatively coupled to the third register, the first multiplexer, the second multiplex and the third multiplexer, and configured to output a fourth symbol stream based on the third symbol stream to each of the first multiplexer, the second multiplex and the third multiplexer.

5. The circuit of claim 4, further comprising a memory storing a logarithm table and an exponent table, wherein each of the first multiplexer, the second multiplex, the third multiplexer, and the fourth multiplexer further comprises:

a first input port configured to receive a first input;

a second input port configured to receive a second input; and an output port configured to output an output signal by generating a sum by adding an exponent representation of the first input and an exponent representation of the second input, wherein exponent representation of the first input and the exponent representation of the second input are obtained by searching the logarithm table;

generating a modulo value by modulo the sum by 255; and converting the modulo value to a polynomial representation by searching the exponent table.

6. A method for error correction, comprising:

generating, by a first Reed-Solomon (RS) syndrome generator, a first RS syndrome for a RS(n, k) code according to a received symbol stream to be decoded, wherein k is the number of data symbols in the received symbol stream to be decoded, and n is the total number of code symbols in the received symbol stream to be decoded;

determining, by a first decision unit communicatively coupled to the first RS syndrome generator, whether there are at least N symbols in the first RS syndrome that equal 0, wherein N is related to a code distance of the RS(n, k) code;

outputting, by a first adder communicatively coupled to the first decision unit, a corrected decoded codeword by adding the first RS syndrome to the received symbol stream to be decoded if there are at least N symbols in the first RS syndrome that equal 0;

storing a logarithm table, an error location table and an error correction value table in a memory;

generating, by a first addressing unit communicatively coupled to both the first decision unit and the memory, an exponent representation of the first RS syndrome by searching the logarithm table if there are less than N symbols in the first RS syndrome that equal 0;

generating, by a second adder communicatively coupled to the first addressing unit, at least one subtracted first RS syndrome by each subsequently subtracting a corresponding one of k groups of error location values in the error location table from the exponent representation of the first RS syndrome;

determining, by a second decision unit communicatively coupled to the second adder, whether N symbols in any of the at least one subtracted first RS syndrome equal each other; and abandoning, by an output port communicatively coupled to the second decision unit, the decoding and send an error indicator if none of the N symbols in any of k subtracted first RS syndromes equal each other.

7. The method according to claim 6, further comprising determining, by the second decision unit, that the sequence of the subtraction for the subtracted RS which has N symbols equal each other corresponds to an error data symbol location, if the second decision unit determines that N symbols in one of k subtracted first RS syndromes equal each other;

retrieving, by a second addressing unit communicatively coupled to the second decision unit, an error bit value corresponding to the error data symbol location by searching the error correction value table using the value of the N symbols that equal each other;

determining, by a third decision unit communicatively coupled to the second addressing unit, whether N+1 symbols in one of the at least one subtracted first RS syndrome equal each other; and generating, by a third adder communicatively coupled to the second addressing unit, a corrected received symbol stream by adding the error bit value to the received symbol stream to be decoded if N+1 symbols in each of the at least one subtracted first RS syndrome equal each other.

8. The method according to claim 7, further comprising:

generating, by a fourth adder communicatively coupled to the third decision unit, a partially corrected received symbol stream by adding the error bit value to the received symbol stream to be decoded if only N symbols in each of the at least one subtracted first RS syndrome equal each other;

generating, by a second RS syndrome generator, a second RS syndrome for a second RS $(n_2, k_2)$ code according to the partially corrected received symbol stream, wherein $k_2$ is the number of data symbols in the partially corrected received symbol stream, and $n_2$ is the total number of code symbols in the partially corrected received symbol stream;

determining, by a fourth decision unit communicatively coupled to the second RS syndrome generator, whether there are at least $N_2$ symbols in the second RS syndrome that equal 0, wherein $N_2$ is related to a code distance of the second RS $(n_2, k_2)$ code; and outputting, by a fifth adder communicatively coupled to the fourth decision unit, a second corrected decoded codeword by adding the second RS syndrome to the partially corrected received symbol stream.

9. The method of claim 8, wherein $n_2$ equals 12, $k_2$ equals 9, and $N_2$ equals 2;

wherein generate, by the first RS syndrome generator, a first RS syndrome for the RS(n, k) code according to a received symbol stream to be decoded further comprises:

outputting, by a sixth adder communicatively coupled to a first multiplexer and a first register, a first symbol stream to the first register by adding a 12-byte received symbol stream to be decoded to an output of the first multiplexer;

outputting, by a seventh adder communicatively coupled to the first register, a second register, and a second multiplexer, a second symbol stream to the second register by adding the first symbol stream to an output of the second multiplexer;

outputting, by an eighth adder communicatively coupled to the second register, a third register, and a third multiplexer, a third symbol stream to the third register by adding the second symbol stream to an output of the third multiplexer; and outputting, by a fourth multiplexer communicatively coupled to the third register, the first multiplexer, the second multiplex and the third multiplexer, a fourth symbol stream based on the third symbol stream to each of the first multiplexer, the second multiplex and the third multiplexer.

10. The method of claim 9, further comprising
storing a logarithm table and an exponent table in a memory, wherein each of the first multiplexer, the second multiplex, the third multiplexer, and the fourth multiplexer is configured to:
receive a first input by a first input port;
receive a second input by a second input port; and
output, by an output port, an output signal by
generating a sum by adding an exponent representation of the first input and an exponent representation of the second input, wherein exponent representation of the first input and the exponent representation of the second input are obtained by searching the logarithm table;
generating a modulo value by modulo the sum by 255; and
converting the modulo value to a polynomial representation by searching the exponent table.

* * * * *